US008141675B2

(12) United States Patent
Xu et al.

(10) Patent No.: US 8,141,675 B2

(45) Date of Patent: Mar. 27, 2012

(54) MICRO-SPEAKER

(75) Inventors: Qian Xu, Shenzhen (CN); Jing He, Shenzhen (CN)

(73) Assignees: AAC Acoustic Technologies (Shenzhen) Co. Ltd., Shenzhen (CN); American Audio Components Inc., La Verne, CA (US)

( * ) Notice: Subject to any disclaimer, the term of this patent is extended or adjusted under 35 U.S.C. 154(b) by 0 days.

(21) Appl. No.: 12/697,250

(22) Filed: Jan. 31, 2010

(65) Prior Publication Data

US 2010/0326766 A1 Dec. 30, 2010

(30) Foreign Application Priority Data

Jun. 26, 2009 (CN) ...................... 2009 2 0133319 U

(51) Int. Cl.

| | |
|---|---|
| ***H05K 5/02*** | (2006.01) |
| ***H05K 5/03*** | (2006.01) |
| ***H04R 1/28*** | (2006.01) |
| ***H04R 1/30*** | (2006.01) |
| *H05K 5/00* | (2006.01) |
| *H04R 1/20* | (2006.01) |

(52) U.S. Cl. ......... 181/148; 381/345; 381/350; 181/152

(58) Field of Classification Search .................. 181/148, 181/152, 159, 199, 155; 381/340, 345, 350, 381/391, 347, 346, 160, 387
See application file for complete search history.

(56) References Cited

U.S. PATENT DOCUMENTS

| | | | | |
|---|---|---|---|---|
| 1,685,086 | A * | 9/1928 | Hutchison | 381/340 |
| 1,755,636 | A * | 4/1930 | Dubilier | 181/159 |
| 1,878,088 | A * | 9/1932 | Zwikker | 181/159 |
| 2,900,040 | A * | 8/1959 | Novak | 181/152 |
| 3,708,702 | A * | 1/1973 | Brunnert et al. | 310/322 |
| 4,166,933 | A * | 9/1979 | Cinquino | 381/389 |
| 4,183,017 | A * | 1/1980 | Sims | 340/384.7 |
| 4,220,831 | A * | 9/1980 | Zink | 381/173 |
| 4,485,275 | A * | 11/1984 | Lahti | 381/341 |
| 4,727,583 | A * | 2/1988 | Weber | 381/332 |
| 4,728,933 | A * | 3/1988 | Mazza | 340/391.1 |
| 5,955,821 | A * | 9/1999 | Yamamoto et al. | 310/324 |
| 6,472,797 | B1 * | 10/2002 | Kishimoto | 310/324 |
| 6,519,348 | B1 * | 2/2003 | Ikeuchi et al. | 381/340 |
| 6,750,758 | B2 * | 6/2004 | Duncan et al. | 340/384.1 |
| 6,968,069 | B1 * | 11/2005 | Zhao | 381/345 |
| 6,969,942 | B2 * | 11/2005 | Takeshima et al. | 310/324 |
| 7,113,813 | B2 * | 9/2006 | Shimokawatoko et al. | 455/575.3 |
| 7,201,252 | B2 * | 4/2007 | Nevill | 181/151 |
| 2003/0165249 | A1 * | 9/2003 | Higuchi | 381/318 |

FOREIGN PATENT DOCUMENTS

| | | | |
|---|---|---|---|
| JP | 58006700 A | * | 1/1983 |
| JP | 60098797 A | * | 6/1985 |
| JP | 60120699 A | * | 6/1985 |

* cited by examiner

*Primary Examiner* — Edgardo San Martin

(74) *Attorney, Agent, or Firm* — Jamie J. Zheng

(57) ABSTRACT

A micro-speaker includes a frame, a case supported by the frame, a sound generator located between the frame and the case. The case has a sound hole and a peripheral plate surrounding the sound hole. The peripheral plate includes an outer surface, an inner surface and an inclining surface extending from the inner surface toward the outer surface.

20 Claims, 2 Drawing Sheets

MICRO-SPEAKER

FIELD OF THE INVENTION

The present invention relates to the art of speakers and, more particularly to a micro-speaker used in a portable electronic device, such as a mobile phone.

BACKGROUND OF THE INVENTION

Generally, an electronic device, such as a mobile phone, uses a speaker as a sound generator.

Typically, a related micro-speaker has a case defining a sound hole, a frame attached to the case for forming a chamber, a magnetic circuit defining a magnetic gap, a diaphragm located in the chamber, and a voice coil attached to the diaphragm. While electrified, the voice coil will be activated to vibrate by the Lorenz Force and further drives the diaphragm to vibrate, which converts the electrical signals to sound waves. The diaphragm needs sufficient space to vibrate for ensuring good acoustic performance. However, as the trend of the volume of the speaker is smaller and smaller, space provided for the diaphragm to vibrate is accordingly reduced and limited.

SUMMARY OF THE INVENTION

Accordingly, an exemplary embodiment of the present invention is provided to resolve the problem mentioned above. According to an aspect of the present invention, a micro-speaker includes a frame, a case supported by the frame, a sound generator located between the frame and the case. The case has a sound hole and a peripheral plate surrounding the sound hole. The peripheral plate includes an outer surface, an inner surface and an inclining surface extending from the inner surface toward the outer surface. The inclining surface forms a tapered cavity.

Other features and advantages of the present invention will become more apparent to those skilled in the art upon examination of the following drawings and detailed description of the exemplary embodiment.

DETAILED DESCRIPTION OF EMBODIMENTS OF THE INVENTION

Reference will now be made to describe an exemplary embodiment of the present invention in detail.

Figure 1:
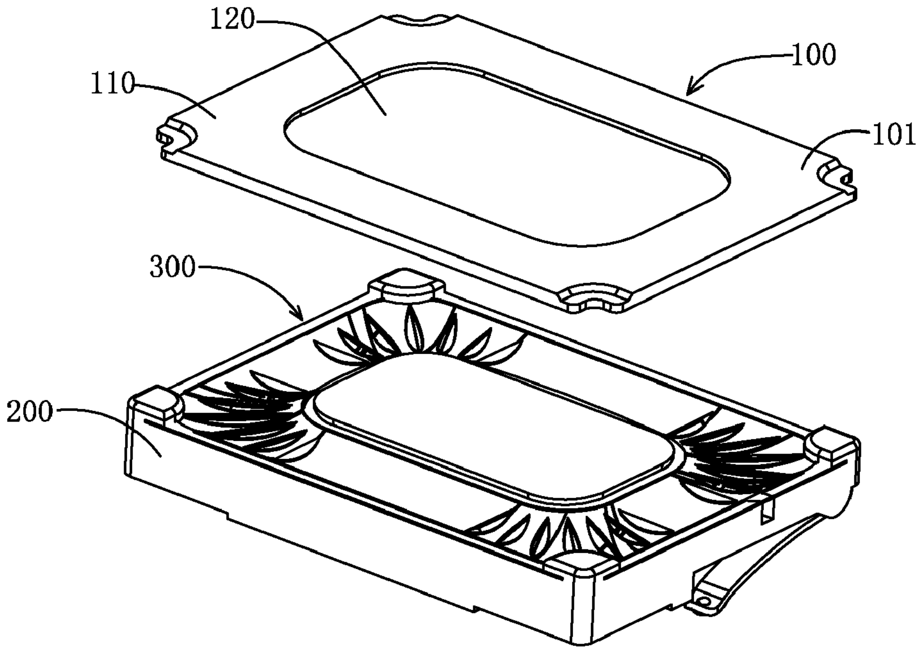
FIG. 1 is an isometric view of a micro-speaker in accordance with an exemplary embodiment of the present invention.
Figure 2:
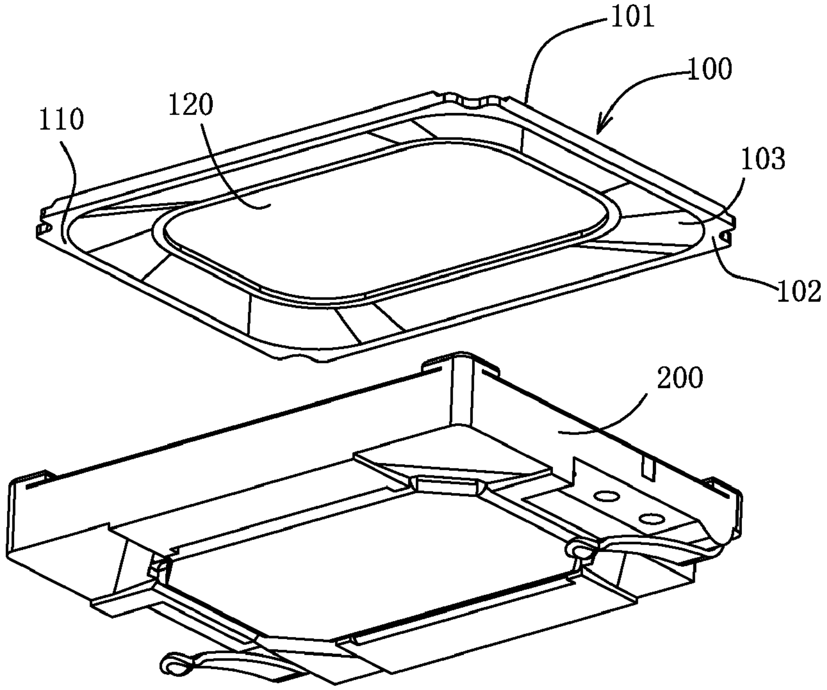
FIG. 2 is an isometric view of the micro-speaker in FIG. 1, from another aspect.

Referring to FIGS. 1-2, a micro-speaker, in accordance with one embodiment of the present invention, comprises a frame 200, a case 100 supported by the frame 200, and a sound generator 300 positioned in the frame. The case 100 defines a sound hole 120 in a central portion thereof and a peripheral plate 110 surrounding the sound hole 120. Only one sound hole is shown in FIG. 1, but the sound hole may be an array including several holes. The peripheral plate 110 has an outer surface 101, an inner surface 102 opposite to the outer surface 101, and an inclining surface 103 extending from the inner surface 102 toward the outer surface 101. Referring to FIGS. 1-4, a width of the outer surface is greater than that of the first and second openings. The length of outer surface is equal to that of the inner surface. A distance between the inclining surface and a portion of the outer surface above the inclining surface is gradually reduced in a direction along which the diaphragm vibrates towards the outer surface.

Figure 3:
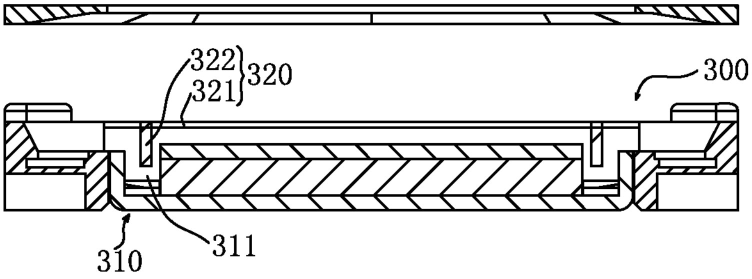
FIG. 3 is a cross-sectional view of the micro-speaker in FIG. 1.

Referring to FIG. 3, the sound generator 300 includes a magnetic circuit 310 defining a magnetic gap 311, and a vibrating unit 320. The vibrating unit 320 has a voice coil 322 partially received in the magnetic gap 311 and a diaphragm 321 attached to the voice coil 322. While electrified, the voice coil 322 is activated to move by Lorenz Force, and accordingly, the diaphragm 321 is driven by the voice coil 322, which produces sound waves.

Figure 4:
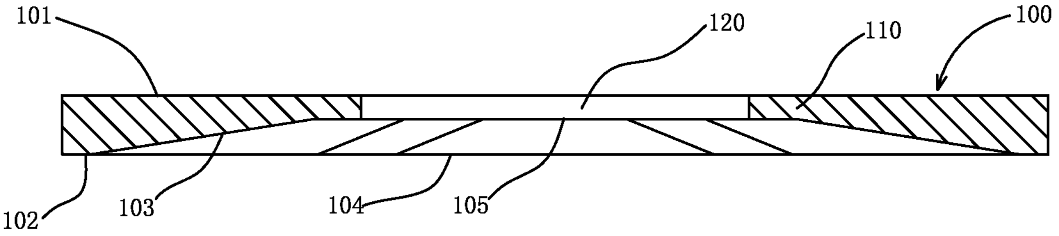
FIG. 4 is an enlarged cross-sectional view of a case of the micro-speaker in FIG. 3.

Referring to FIG. 4, the inclining surface 103 of the peripheral plate 110 of the case 100 defines a first opening 104 in the inner surface 102 and a second opening 105 substantially close to the outer surface 101. A width of the first opening 104 is greater than that of the second opening 105. Accordingly, a tapered cavity is formed by the inclining surface 103. While vibrating, the diaphragm 321 can be partially received in the tapered cavity. In order not to limit the vibration of the diaphragm 321 completely, the first opening is designed to have a diameter greater than that of the diaphragm 321. The second opening 105 may has a diameter greater than that of the sound hole 120.

As shown in FIGS. 3 and 4, the peripheral plate 110 has an inner perimeter defining the sound hole 120 and an outer perimeter. The substantially flat outer surface 101 extends between the inner perimeter and the outer perimeter and the substantially flat inner surface 102 is near the outer perimeter. The peripheral plates 110, and thus the case 100, are thicker at the outer perimeter than at the inner perimeter such that a tapered cavity is formed under the case 100 to provide space for the diaphragm 321 when it vibrates. The outer surface 101 surrounds the sound hole 120. The first opening 104 is larger than the second opening 105 and the second opening 105 is larger than the sound hole 120. The sound hole 120 is substantially centered with respect to the peripheral plate 110. As shown in FIG. 2, a width of the outer surface 101 is about equal to that of the inner surface 102.

In brief, disclosures of the present invention provide a micro-speaker including a case defining an inclining inner surface for forming an enlarged space for the vibration of the diaphragm.

While the present invention has been described with reference to a specific embodiment, the description of the invention is illustrative and is not to be construed as limiting the invention. Various of modifications to the present invention can be made to the exemplary embodiment by those skilled in the art without departing from the true spirit and scope of the invention as defined by the appended claims.

What is claimed is:

1. A micro-speaker comprising:

a frame;

a case supported by the frame, the case having a sound hole and a peripheral plate surrounding the sound hole; and a sound generator located between the frame and the case, the sound generator having a magnetic circuit and a vibrating unit including a diaphragm, the magnetic circuit including a magnetic gap, and the vibrating unit further including a voice coil partially received in the magnetic gap; wherein the peripheral plate has a substantially flat outer surface, an inner surface opposite to the outer surface, and an inclining surface extending from the inner surface toward the outer surface, the inclining surface defines a first opening in the inner surface and a second opening substantially close to the outer surface, the first opening is larger than the second opening.

2. The micro-speaker as described in claim 1, wherein a distance between the inclining surface and a portion of the outer surface above the inclining surface is gradually reduced in a direction along which the diaphragm vibrates towards the outer surface.

3. The micro-speaker as described in claim 1, wherein a width of the outer surface is greater than that of the second opening.

4. The micro-speaker as described in claim 1, wherein a width of the outer surface is equal to that of the inner surface.

5. The micro-speaker as described in claim 1, wherein the second opening is larger than the sound hole.

6. A micro-speaker, comprising:

a frame accommodating a sound generator therein; and a case supported by the frame, the case having a sound hole, an outer surface surrounding the sound hole, an inner surface opposed to the outer surface, and an inclining surface extending from the inner surface toward the outer surface such that the case is thinner near the sound hole than near the inner surface and defining a first opening in the inner surface and a second opening substantially close to the outer surface; wherein the inclining surface defines a tapered cavity for partially receiving a part of the sound generator during the process of generating sound; and wherein the sound generator includes a magnetic circuit and a vibrating unit, the vibrating unit has a voice coil partially received in the magnetic circuit and a diaphragm attached to the voice coil.

7. The micro-speaker as described in claim 6, wherein a distance between the inclining surface and a portion of the outer surface corresponding to the inclining surface is gradually reduced in a direction along which the diaphragm vibrates towards the outer surface.

8. The micro-speaker as described in claim 6, wherein a width of the outer surface is greater than that of the second opening.

9. The micro-speaker as described in claim 6, wherein a width of outer surface is equal to that of the inner surface.

10. The micro-speaker as described in claim 6, wherein the diaphragm is partially received in the tapered cavity during the process of generating sound.

11. The micro-speaker as described in claim 10, wherein the the second opening is close to the sound hole and is larger than the sound hole.

12. The micro-speaker as described in claim 1, wherein the second opening is closer to the sound hole than to the first opening.

13. The micro-speaker as described in claim 1, where the case is thinner near the sound hole than near the inner surface.

14. The micro-speaker as described in claim 11, wherein the opening is closer to the sound hole than to the inner surface.

15. A micro-speaker comprising:

a frame accommodating a sound generator therein, the sound generator having a magnetic circuit and a vibrating unit including a diaphragm; and a case supported by the frame, the case having a sound hole and a peripheral plate surrounding the sound hole, the peripheral plate having an inner perimeter defining the sound hole and an outer perimeter, the peripheral plate being thicker at the outer perimeter than at the inner perimeter such that a tapered cavity is formed under the case to provide space for the diaphragm when it vibrates.

16. The micro-speaker as described in claim 15, wherein the peripheral plate has a substantially flat outer surface extending between the inner perimeter and the outer perimeter.

17. The micro-speaker as described in claim 16, wherein the peripheral plate has a substantially flat inner surface near the outer perimeter, the inner surface defining an opening.

18. The micro-speaker as described in claim 17, wherein the peripheral plate has an inclining surface extending from the opening of the inner surface toward the sound hole.

19. The micro-speaker as described in claim 18, wherein the inclining surface defines an opening that is closer to the sound hole than to the opening of the inner surface.

20. The micro-speaker as described in claim 15, wherein the sound hole is substantially centered with respect to the peripheral plate.

* * * * *